United States Patent [19]

Novak

[11] Patent Number: 5,998,889
[45] Date of Patent: Dec. 7, 1999

[54] ELECTRO-MAGNETIC MOTOR COOLING SYSTEM

[75] Inventor: W. Thomas Novak, Hillsborough, Calif.

[73] Assignee: Nikon Corporation, Tokyo, Japan

[21] Appl. No.: 08/963,480

[22] Filed: Nov. 3, 1997

Related U.S. Application Data

[63] Continuation of application No. 08/763,570, Dec. 10, 1996, abandoned.

[51] Int. Cl.$^6$ ............................. H02K 41/00; H02K 9/19
[52] U.S. Cl. .................................................. 310/12; 310/54
[58] Field of Search ................................. 310/12, 13, 14, 310/89, 58, 59, 60 R, 61, 62, 63, 60 A, 54; 318/135

[56] References Cited

U.S. PATENT DOCUMENTS

| | | | |
|---|---|---|---|
| 4,625,132 | 11/1986 | Chitayat | 310/13 |
| 4,772,828 | 9/1988 | Heymans et al. | 318/128 |
| 4,839,545 | 6/1989 | Chitayat | 310/12 |
| 4,906,878 | 3/1990 | Twaalfhoven et al. | 310/12 |
| 4,916,340 | 4/1990 | Negishi | 310/12 |
| 5,067,512 | 11/1991 | Jacobsen et al. | 137/83 |
| 5,073,734 | 12/1991 | Combette | 310/65 |
| 5,258,671 | 11/1993 | Vollenwyder et al. | 310/12 |
| 5,448,118 | 9/1995 | Nakamura et al. | 310/54 |
| 5,854,525 | 12/1998 | Pommelet | 310/214 |

FOREIGN PATENT DOCUMENTS

| | | | |
|---|---|---|---|
| 2952095 | 7/1980 | Germany | 310/43 |
| 5-45102 | 8/1989 | Japan | |
| 8-168229 | 6/1996 | Japan | |

*Primary Examiner*—Nestor Ramirez
*Assistant Examiner*—Judson H. Jones
*Attorney, Agent, or Firm*—Thomas S. MacDonald; Debra A. Chun

[57] ABSTRACT

A lithographic system includes a chamber housing a stage mechanism and a linear motor coil that drives the stage mechanism. The linear motor includes a coil having two sidewalls, the coil being movable along a magnet track generating a magnetic field. A pair of jacket walls are attached to respective ones of each of the coil sidewalls. Each jacket wall has a pair of relatively thin non-magnetic plates of about 0.75 mm thickness bonded together, at least one facing surface of each of the plates including a liquid flow channel. The plates are made of a non-conductive (and non-magnetic) material, e.g. ceramic such as alumina. Coolant liquid from a liquid source flows through the flow channel in each of the jacket walls. In one embodiment a cooling system is provided where the linear motor coil has a cooling and recirculation circuit including a tank which is kept at a negative pressure of from about –3 psig to about –13 psig. In another embodiment a cooling system is provided where the force produced by the motor coil is minimized so that heat dissipation from the motor coil during a low duty cycle is substantially identical to heat dissipation in a high duty cycle. This is done in a three-phase motor coil by having two phases energized to provide force in sum total equal and opposite to the force from the remaining phase.

28 Claims, 5 Drawing Sheets

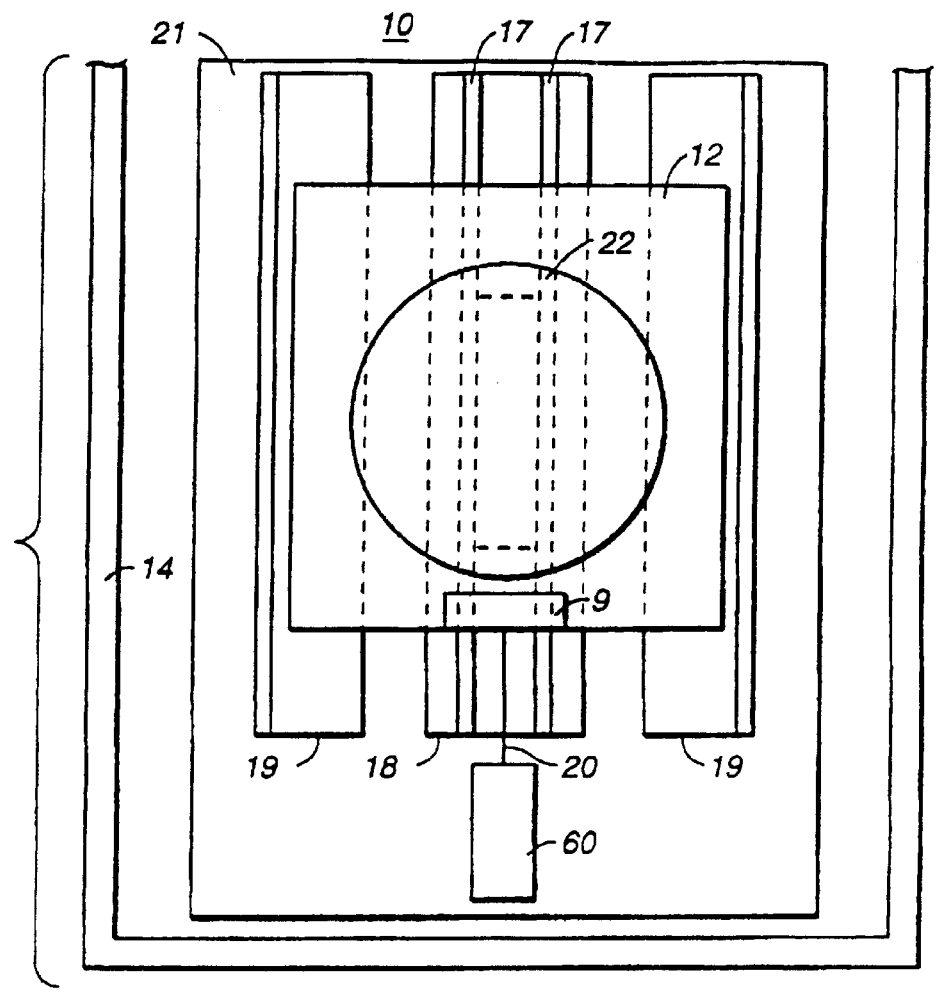
FIG._1
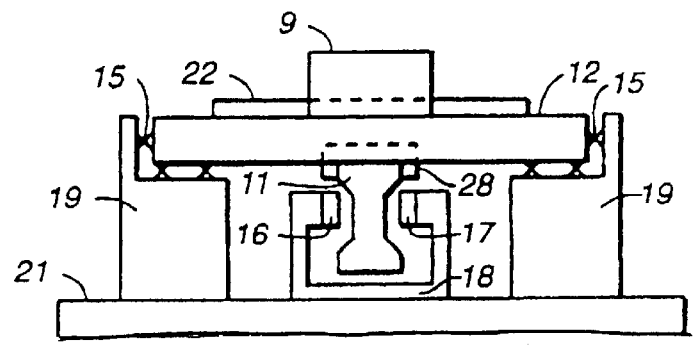
FIG._2

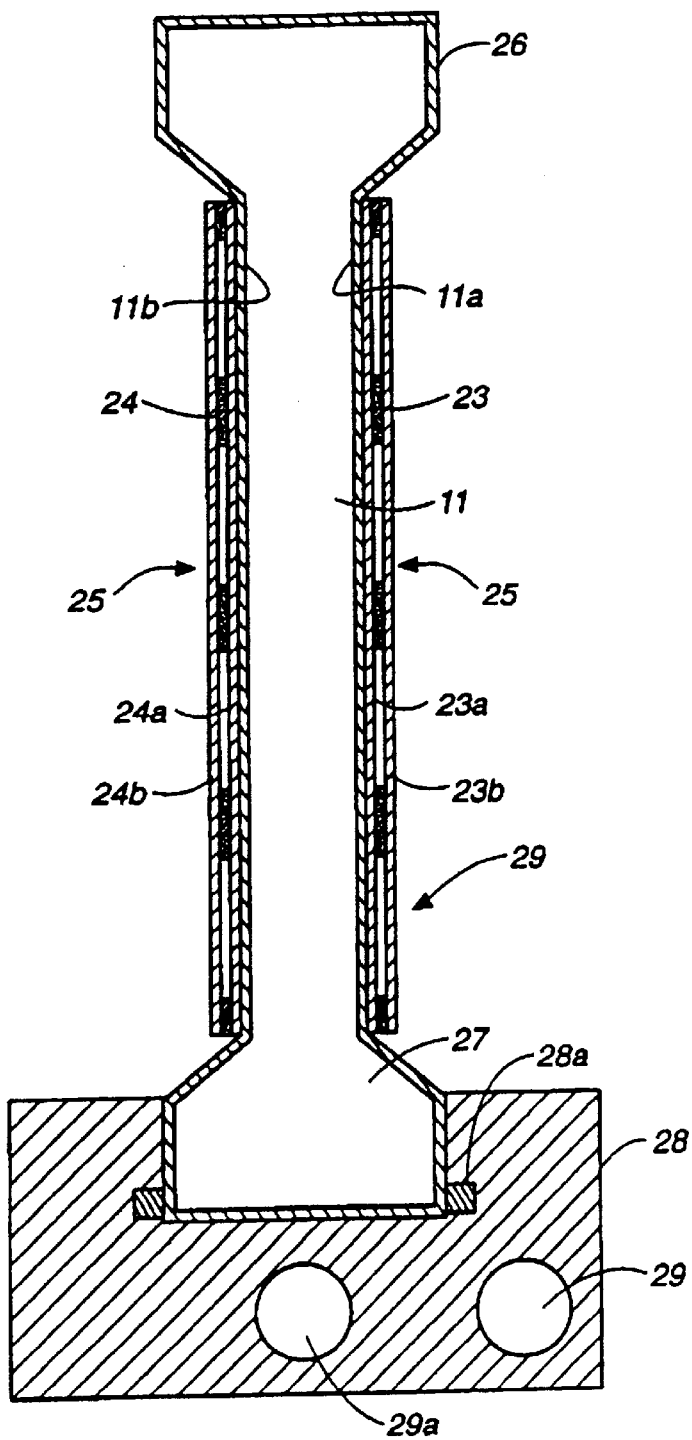
FIG._3
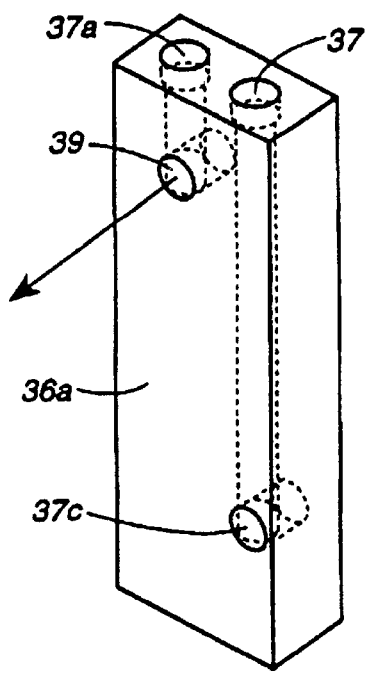
FIG._6
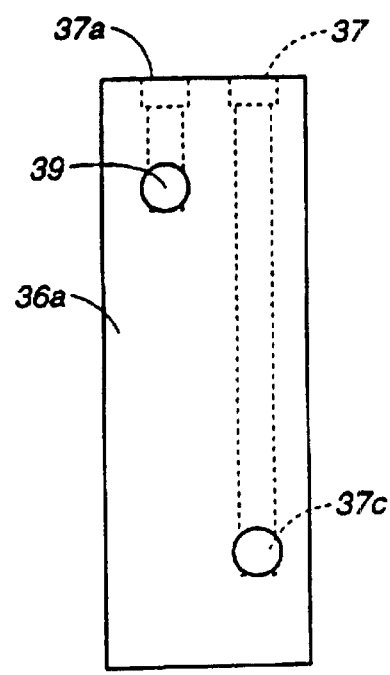
FIG._7

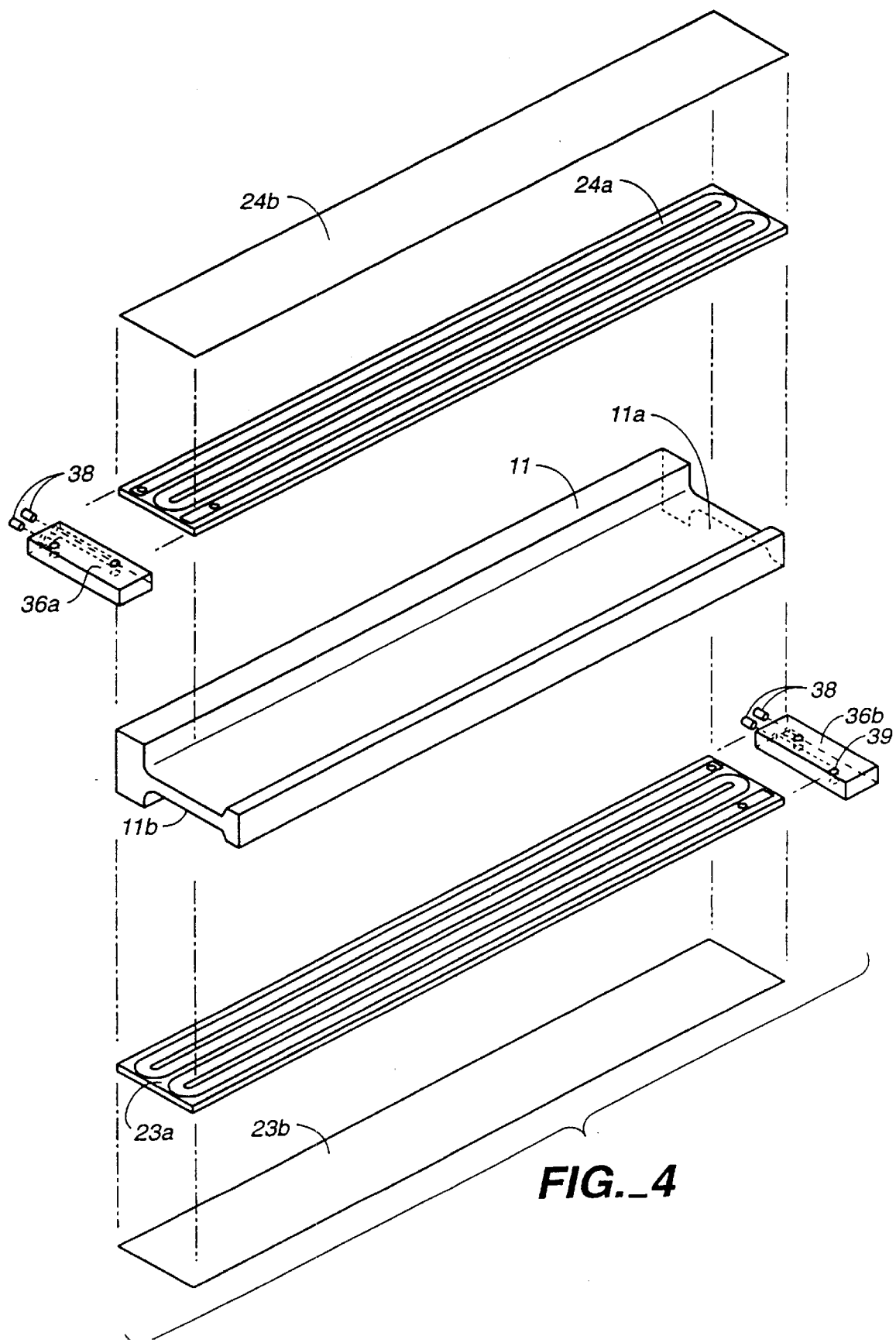
FIG._4

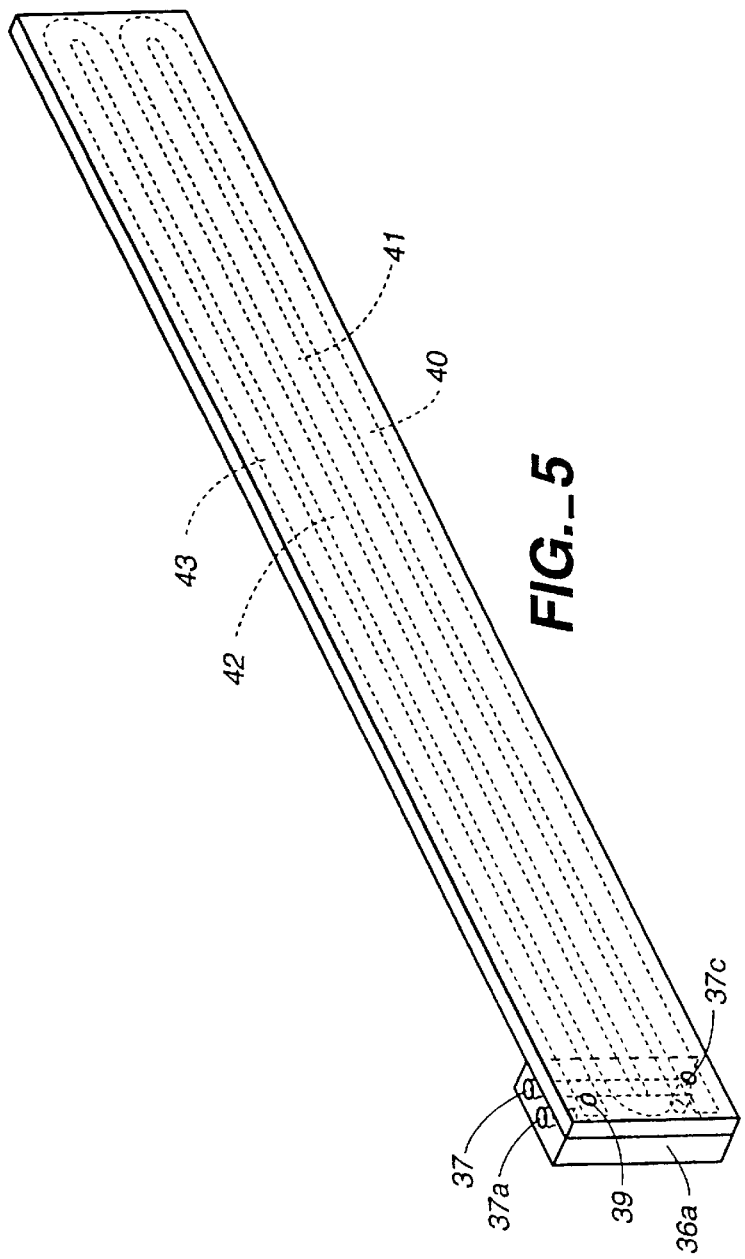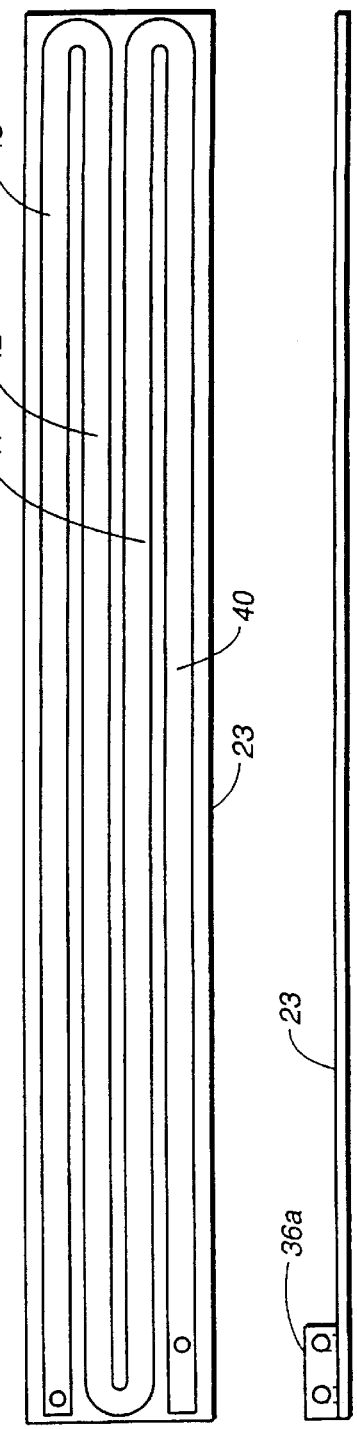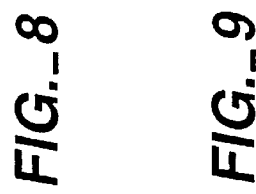

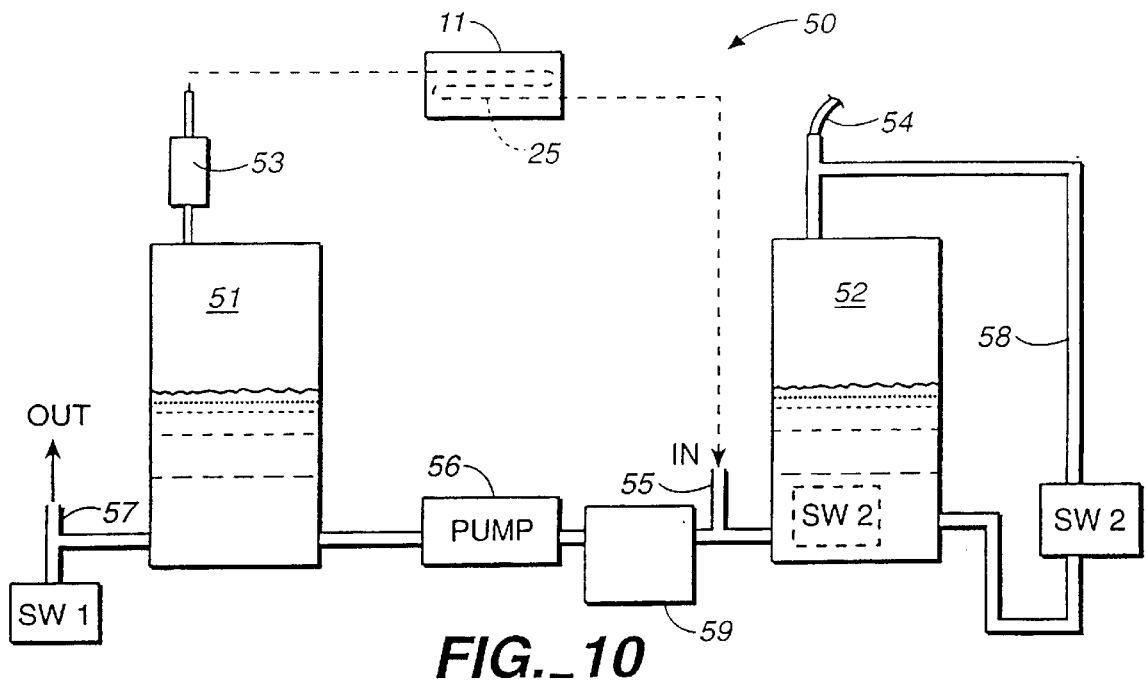
FIG._10
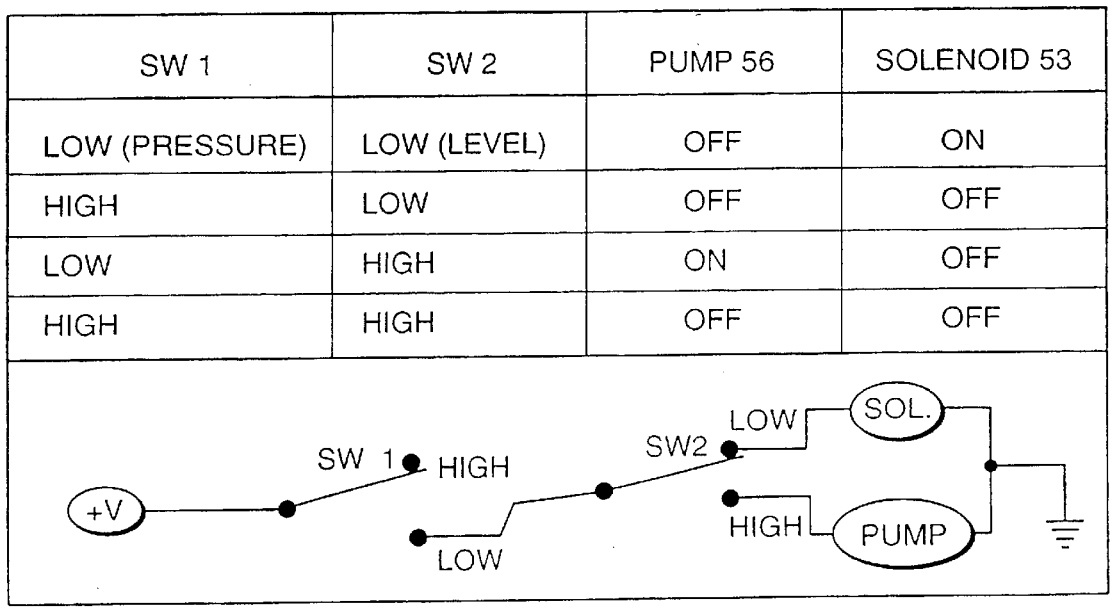
FIG._11

ELECTRO-MAGNETIC MOTOR COOLING SYSTEM

This application is a continuation of application Ser. No. 08/763,570, filed Dec. 10, 1996 now abandoned.

BACKGROUND OF THE INVENTION

The present invention relates to electro-magnetic motors, particularly to cooling apparatus for a linear electric motor.

Heating or cooling of air next to a linear motor coil can be caused by poor temperature stability of the linear motor coils. When a linear electric motor is associated with a stage of a lithographic system used for positioning semiconductor wafers for lithographic processing, the interferometric metrology (location measurement) of the lithographic system will be degraded in performance by air temperature fluctuations in critical areas within an environmental chamber. The flow rate of the air in the chamber is sufficiently high so that air turbulence is unavoidable. The details of the turbulence depend on the chamber and stage mechanism geometries. The turbulence itself does not affect the interferometer beams which are used to monitor the exact position of a wafer stage. However, if the air in the chamber varies in temperature, and therefore in density and refractive index, the turbulence mixes air with different properties, leading to fluctuations in the interferometer optical path length.

Heretofore various linear motor cooling systems have been proposed. These are typified by U.S. Pat. No. 4,916,340 where a combination of insulating material and a variable flow liquid cooling mechanism are utilized to eliminate the problems associated with excess heat generated by the linear motors. A "thermostat" approach is employed to maintain a zero temperature differential between a surface plate and the linear motor. The cooling medium is contained in a cooling medium tank which is maintained at a constant temperature by a separate device (not detailed); this cooling medium is circulated via flexible tubes by means of a pump and four (4) solenoid valves. These valves are in turn controlled automatically by a temperature controlling circuit. When power is applied to coils of a linear motor mounted on a stage, the yoke supporting the associated magnet track moves rectilinearly and at the same time produces heat at the coils. If this heat is transmitted to a base supporting the stage, it produces a deformation of the base which degrades the moving accuracy of the stage. As the solenoid valves are opened, the cooling medium is fed under pressure into flexible tubes and then into various linear cooling conduits whereby the heat is removed. As a result the temperature difference between each linear motor and the base is reduced to zero.

U.S. Pat. No. 4,839,545 describes a cooling system for linear motors where an armature of a linear motor is cooled by serpentine channels formed in laminations of the armature. U.S. Pat. No. 4,625,132 describes a linear motor with a seal for an opening in a U-shaped channel and for directing a controlled flow of cooling gas under a positive pressure to a wound field-generating element (coil) of the motor between the stator and moving element.

While others have constructed linear motor coils with aluminum or other metal cooling jackets, the movement of the included jackets causes electric eddy currents which introduce drag. The linear motor has to be driven harder to generate greater force to compensate for the drag and as a result uses more energy. This reduces the motor efficiency. Efficiency is maximized by placing as much as possible of the coil wire in the moving gap between the linear coil and the magnet track, and efficiency decreases approximately as a square of the gap between the magnet track and the coil.

SUMMARY OF THE INVENTION

The present invention prevents heating of air next to a linear motor coil which in turn prevents the degradation of performance of the interferometric metrology of a lithographic system caused by air temperature fluctuations in critical areas within an environmental chamber, particularly where the interferometer laser beams are transmitted through the critical areas. The invention also improves the temperature stability of the linear motor coils as well as reduces the likelihood of cooling fluid leaking from hose connections and other parts of a closed circuit fluid cooling system. In a further embodiment, the linear motor coil temperature is stabilized even though the motor duty cycle may be changing from high use to idle. Apparatus is described where the linear motor coil is embedded within a ceramic (e.g. alumina) cooling jacket with cooling liquid circulating within the jacket. The jacket is positioned within the magnetic field generated by the linear motor coil. The cooling system improves the thermal stability of the coil by keeping constant the power dissipated in the coil. The closed cooling circuit is provided with a negative pressure relative to the air pressure of the surrounding ambient atmosphere.

The apparatus for cooling includes a linear motor coil fixed to an object to be moved (e.g. the stage), the coil having two sidewalls and being movable along a magnet track within a magnetic field generated by the magnet track. A pair of jacket walls are provided, each jacket wall being attached to a respective one of each of the coil sidewalls. While typically the coil is fixed to the stage and the magnet track is fixed e.g. to a base, the opposite arrangement is also within the scope of the invention. Each jacket wall includes a pair of non-magnetic and essentially non-electrically conductive but thermally conductive plates, such as alumina ceramic plates, bonded together, at least one facing surface of each of the plates including a liquid flow channel, and means for flowing a coolant liquid (fluid) through the flow channel in each of the jacket walls. These plates thereby do not support any eddy currents.

In another embodiment, there is only one jacket wall, on only one sidewall of the coil. In one embodiment, the jacket wall is a single plate, with the coolant liquid flowing either in a channel in the interior of the plate or in a channel in a facing surface of the plate with the motor coil sidewall defining the other surface of the channel, i.e. the coolant liquid circulates between the plate and the motor coil sidewall.

BRIEF DESCRIPTION OF THE DRAWINGS

FIG. 1 is a schematic top view of a stage within a stepper chamber, where a linear motor coil drives the stage relative to the chamber;

FIG. 2 is a schematic side view of the structure of FIG. 1;

FIG. 3 is a cross-sectional end view of the linear coil showing attached cooling plates;

FIG. 4 is an exploded view of the cooling plates;

FIG. 5 is a perspective view of the cooling plate per se with associated inlet;

FIG. 6 is a perspective view of the inlet thereof;

FIG. 7 is a side view of the cooling plate inlet;

FIG. 8 is a top view of a cooling plate;

FIG. 9 is a side view thereof;

FIG. 10 is a schematic diagram of the recirculating cooling system; and

FIG. 11 is a switching diagram therefor.

DETAILED DESCRIPTION

FIG. 1 schematically shows a stepper chamber 14 in a lithographic measuring and processing system 10. The lithographic system 10 includes a stage 12 (reticle or wafer stage) and an apparatus floor support surface 21. A yoke 18 and two linear guideways 19 are mounted on the floor support surface 21. The stage 12 has a mirror system 9 and a wafer table 22 mounting a wafer on the upper surface thereon, and has a linear motor coil 11 driving the stage 12 on the under surface. In order to measure the position of the stage 12, the interferometry measurement emits a laser beam 20 directly through the mirror system 9. As is known in the interferometry measurement art, the beam is passed through a 45° beam splitter to a reference plane in the interferometry measurement, the beam then reflects back, to measure the distance of light to that reference plane, and then again reflected by the beam splitter to a sensor in the interferometry measurement.

FIG. 2 shows the side-face of the stage 12. The stage 12 is supported by e.g. air bearings 15 on the linear guide 19, typically a smooth flat granite surface. Roller bearings or magnetic bearings may also be utilized. Coil magnets or permanent magnets 17 are mounted on inwardly-facing surfaces 16 of the yoke 18. The magnets 17 on one side of the coil 11 and those on the other side of coil 11 have facing negative poles respectively, so the magnets 17 produce a magnetic field. Magnets 17 collectively are a magnet track.

FIG. 3 illustrates the linear motor coil 11 having two sidewalls 11a and 11b to which a pair of jacket walls 23 and 24 are affixed by adhesive, such as an epoxy adhesive. Except for the present cooling apparatus, the motor coil 11 is conventional of the type supplied by Trilogy, e.g. model Trilogy1C. Each jacket wall 23 and 24 preferably comprises an inner jacket wall (plate) 23a and 24a, respectively and an outer jacket wall (plate) 23b and 24b, respectively forming an overall cooling jacket 25. A portion 27 of the motor coil is configured to fit within a coolant inlet housing block 28 and fixed by adhesive or molded plastic or epoxy. (FIG. 3 shows the motor coil inverted from its orientation in FIG. 2; the housing block 28 is shown in FIG. 2 at the upper end of the motor coil 11). The housing block 28 is typically of aluminum and has a cooling liquid inlet 29 and outlet 29a. A locking projection 28a filled with epoxy adhesive may be provided to firmly lock motor portion 27 into housing block 28. The fluid connections between housing block 28 and inner jacket walls 23a, 24b are not shown as being outside the plane of the drawing, but are via structures 36a, 36b described below.

FIG. 4 shows the various elements of the linear coil and the jacket walls. Plate 23a containing a serpentine coolant pathway 40–43 and cover plate 23b, which are joined together by an epoxy bond, are also affixed by epoxy to the sidewall 11b of the linear motor coil. Plate 24a, also containing a serpentine pathway, is bonded to sidewall 11a and a cover plate 24b is bonded to the plate 24a. Inlet structures 36a and 36b are inserted and fastened to the jacket walls. (Inlet structures 36a, 36b are outside the plane of the drawing of FIG. 3.) The inlet structures may be constructed of Nylon, Lexan, Plexiglas or ceramic (non-magnetic) materials. Hose connectors 38 such as standard flare fittings provide connections to the serpentine coolant pathways including recirculation of the coolant. Similar hose connectors (not shown) connect inlet structures 36a, 36b to housing block 28 of FIG. 3. The coolant may be water or another suitable liquid.

The coolant pathways are in the form of folded three-loop serpentine pathways comprising (FIG. 5) a first path 40 extending from coolant fluid inlet 37c to a second parallel path 41, to a third parallel path 42, to a fourth parallel path 43 and to a cooling fluid outlet 39 in communication with outlet 37a. As seen in FIGS. 5–7, a coolant liquid recirculation inlet 37 extends from the end cap 36a to inlet 37c into path 40. The coolant pathways are typically 7 mm wide ×0.5 mm deep fluid channels. In a preferred embodiment the jacket walls 23 and 24 including both the pathway containing plates and cover plates are constructed of heat conductive ceramic material, e.g. alumina such as 96% $Al_2O_3$ available from Coors Ceramic of Golden, Colo.

FIGS. 8 and 9 illustrate the jacket wall 23 showing the serpentine pathway in detail. In one embodiment the jacket walls 23a, 24a are 356.12 mm long, 45 mm wide and 0.75 mm thick. The cover plates 23b, 24b are about 0.5 mm to about 0.75 mm thick. The jacket walls 23, 24 each have a total thickness of from about 1 mm to about 2 mm.

FIG. 10 illustrates an exemplary coolant fluid recirculating system 50 in which a pair of tanks 51 and 52 provide a negative pressure for insuring that a pumped flow of coolant liquid will not leak out of the system. Other coolant flow arrangements are also possible. The coolant may be a gas or gas/liquid mixture. A closed circuit fluid cooling system provides coolant to the linear motor and linear motor cooling coil 11 jacket 25. The system maintains a negative pressure, such as −3 psig, relative to the surrounding atmosphere. A range of from about −3 psig to about −13 psig is preferable; this range is dependent on the vapor pressure of the coolant liquid. The input pressure to the linear motor coil 11 and the panels 23 and 24 attached thereto is held slightly below atmospheric (ambient) pressure while the output side is kept at a pressure closer to a vacuum. No part of the liquid circuit is above atmospheric pressure. As a result, no liquid will escape if a small break in the liquid circuit occurs and there is an opening to the exterior of the circuit.

A conventional air solenoid valve 53 operates to introduce air to chamber 51 to move excessive liquid from chamber 51. Vacuum connection 54 connected to a vacuum source (not shown) is connected to tank 52. A negative pressure generally of about −13 psig is supplied at inlet 54. Two sensor driven switches SW1 and SW2 are provided, where SW1 senses a pressure differential of about 3 psi ±0.1 psi, from atmospheric pressure and SW2 senses the liquid level inside tank 52. The switch SW2 may be in the tank 52 or in the line 58 leading to the tank. SW2 is shown in the former position by dashed lines. Pump 56 functions to over-ride the vacuum and pulls liquid from tank 52 and moves it to tank 51. A heat exchanger 59 is part of the recirculation circuit to remove the heat from the motor coil from the coolant liquid; the heat exchanger 59 is at any convenient location in the recirculation circuit.

FIG. 11 shows a logic table for controlling the switches, the pump and the solenoid valve, as well as a switching diagram. During the cycle a pressure low condition combined with a high level in tank 52 turns on the pump 56. Other conditions sensed by pressure switch SW1 and level switch SW1 turn off the pump 56.

The motor coil's power supply is controlled by an electronic computer (not shown). The computer adjusts the electric power to the coil windings to produce the force to drive the stage. In one embodiment requiring no flow control of the coolant, if no motor force is needed because the stage is inactive, the computer energizes the coil in such a way as to minimize the force produced by the coil, yet dissipates heat within the coil. The motor is energized such that the heat dissipation during a period of low duty cycle is substantially identical to the heat dissipation during periods of high duty cycle.

This can be done in several ways.

1. The coil can be energized with alternating polarity voltage at high frequency. This frequency is sufficiently high that the mechanical elements attached to the motor do not have time to respond (move). The frequency must be low enough that the amplifier which drives the coil will still respond and energize the coil to allow dissipation of heat within the coil.
2. For a three phase linear motor, the coil can be energized in such a way that low force or zero force is produced, even though the motor coil is dissipating considerable heat. One phase can be energized to produce a force in a positive direction and the other two phases energized to produce, in sum total, a force equal and opposite to the force of first phase.
3. The coil of the motor coil can be wound in such a way that the linear motor has two modes of operation. One mode allows the linear motor to operate normally. The second mode changes the current in half of the motor coil to flow in the opposite direction, thereby canceling the force produced by the other half of the coil.
4. When the stage mechanism is nominally idle, the stage can be mechanically locked in place using any one of several techniques. With the stage locked, the coil can be energized without producing stage motion.

The coil assembly for a typical large linear motor has a large thermal mass compared to input power, and therefore the time constant for temperature change of the coil is rather long (1 to 15 minutes). Therefore, the power applied to the motor can be very irregular during a period shorter than the thermal time constant. The only requirement is that the heat dissipation averaged over a time roughly equal to the thermal time constant is stable.

The above description of the preferred embodiment of this invention is illustrative and not limiting. Other embodiments of this invention will be obvious to those skilled in the art in the above disclosure. For instance, the depicted arrangement of FIG. 1 is only exemplary; alternatively, any other support for the magnet track (or two spaced apart magnet tracks) may be used. For instance, a flat surface can be provided on which the stage is supported and moves, and a fixed or movable guide or guides provided on the flat surface to guide movement of the stage, with the magnet track(s) mounted on or adjacent to the guide(s). Of course, alternatively, the motor coil can be mounted on the surface and the magnet track(s) mounted on the stage.

What is claimed is:

1. Apparatus for cooling a linear coil motor comprising:
   a linear motor coil having two sidewalls and being movable along a magnet track within a magnetic field generated by the magnet track;
   at least one jacket wall, said jacket wall being attached to one of said sidewalls, said jacket wall comprising at least one non-conductive plate, said plate defining a flow channel; and
   means for flowing a coolant fluid through said flow channel.
2. The apparatus of claim 1 wherein said plate comprises a ceramic plate.
3. The apparatus of claim 1, said jacket wall comprising a second non-conductive plate bonded to said plate, a space between said first plate and said second plate defining said flow channel.
4. The apparatus of claim 1, further comprising a second jacket wall attached to the other of said sidewalls, said second jacket wall comprising at least one non-conductive plate, said plate of said second jacket wall defining a second flow channel, and said second flow channel communicating with said means for flowing.
5. The apparatus of claim 3 wherein each of said plates has a thickness of from about 0.5 mm to about 2 mm.
6. The apparatus of claim 1 wherein said flow channel is serpentine.
7. The apparatus of claim 1 further including a recirculation circuit for recirculating coolant fluid exiting said flow channel, and wherein said recirculation circuit is kept at an internal pressure below atmospheric pressure.
8. The apparatus of claim 7 in which said recirculation circuit includes at least a portion at a negative pressure of from about −3 psig to about −14 psig.
9. The apparatus of claim 1 further including means for minimizing force produced by said motor coil such that heat dissipation from said motor coil during a low duty cycle is substantially identical to heat dissipation during a high duty cycle.
10. The apparatus of claim 9 wherein said means for minimizing force includes means for energizing said motor coil with a voltage of alternating polarity at a sufficiently high frequency to prevent said motor coil from moving relative to said magnet track.
11. The apparatus of claim 9 wherein said motor coil is a three-phase motor coil and wherein said means for minimizing the force comprises energizing a first phase of said motor coil for producing a force in a first direction and energizing the other two phases of said motor coil to produce in sum total a force equal and opposite in direction of the force of said first phase.
12. The apparatus of claim 9 wherein said motor coil has a first normal operating mode and a second operating mode, wherein in said second operating mode an electric current in a first half of said motor coil flows in an opposite direction to an electric current in a second half of said motor coil.
13. The apparatus of claim 9 wherein said means for minimizing includes a locking mechanism preventing movement of said motor coil relative to said magnetic track when said motor coil is energized.
14. A system including a stage and a linear motor coil driving the stage, wherein said motor coil has two sidewalls and said motor coil is movable along a magnet track within a magnetic field generated by the magnet track comprising:
    a jacket wall, said jacket wall being attached to one of said sidewalls, said jacket wall comprising at least one non-conductive plate, said plate defining a flow channel; and
    means for flowing a coolant fluid through said flow channel.
15. The system of claim 14 wherein said plate comprises a ceramic plate.
16. A system including a movable object and a linear motor coil driving said movable object and means for cooling said motor coil, said means for cooling including a recirculation circuit kept at an internal pressure below atmospheric pressure.
17. The system of claim 16 wherein said internal pressure is in a range of −3 psig to −14 psig.
18. A system including a movable object and a linear motor coil driving said movable object and further including means for minimizing the force produced by the motor coil such that heat dissipation from the motor coil during a low duty cycle is substantially identical to heat dissipation during periods of a high duty cycle.

19. The system of claim 18 wherein said means for minimizing includes means for energizing said motor coil with a voltage of alternating polarity at a sufficiently high frequency to prevent said motor coil from moving relative to said magnet track.

20. The system of claim 19 wherein said motor coil is a three-phase motor coil and wherein said means for minimizing the force comprises energizing a first phase of said motor coil for producing a force in a first direction and energizing the other two phases of said motor coil to produce in sum total a force equal and opposite in direction of the force produced by said first phase.

21. The system of claim 18 wherein said motor coil has a first normal operating mode and a second operating mode, wherein in said second operating mode, an electric current in a first half of said motor coil flows in an opposite direction to an electric current in a second half of said motor coil.

22. The system of claim 18 wherein said means for minimizing includes a locking mechanism coupled to said moveable object, thereby preventing movement of said moveable object when said motor coil is energized.

23. Apparatus for cooling a coil motor comprising:

a magnet member which generates a magnet field;

a motor coil disposed in said magnet field, said motor coil having an outwardly-facing sidewall;

a non-conductive plate disposed between said magnet member and said sidewall of said motor coil, and apart from said sidewall, said non-conductive plate defining a flow channel between said sidewall and said non-conductive plate; and a coolig device connected to said flow channel, said cooling device flows a coolant fluid through said flow channel.

24. The apparatus of claim 23, wherein said non-conductive plate comprises a ceramic plate.

25. An apparatus for cooling a linear coil motor comprising:

a linear motor coil having two outwardly facing sidewalls and being movable along a magnet track within a magnetic field genreated by the magnet track;

at least one jacket wall, said jacket wall being attached to one of said sidewalls, said jacket wall comprising at least one non-conductive first plate, said first plate defining a flow channel between the one sidewall and at least one jacket wall; and a cooling device connected to said flow channel, said cooling device flows a coolant fluid through said flow channel.

26. A system including a stage and a linear coil motor driving the stage, wherein said motor coil has two outwardly-facing sidewalls and said motor coil is movable along a magnet track within a magnetic field generated by the magnet track, comprising:

a jacket wall, said jacket wall being attached to one of said sidewalls, said jacket wall comprising at least one non-conductive plate, said plate defining a flow channel between the one sidewall and at least one jacket wall; and a cooling device connected to said flow channel, said cooling device flows a coolant fluid through said flow channel.

27. A system comprising:

a movable object;

a linear motor connected to said movable object, said linear motor drives said movable object and includes a linear motor coil; and a cooling device disposed adjacent at least one side of said linear motor coil, said cooling device includes a recirculation circuit kept at an internal pressure below atmospheric pressure.

28. A system comprising:

a movable object;

a linear motor coil connected to said movable object, said linear motor coil drives said movable object; and a controller connected to said linear motor coil, said controller minimizes a force produced by the motor coil such that heat dissipation from the motor coil during a low duty cycle is substantially identical to heat dissipation during a high duty cycle.

* * * * *